United States Patent [19]

Shah et al.

[11] Patent Number: 5,017,815
[45] Date of Patent: May 21, 1991

[54] SENSE AMPLIFIER WITH SELECTIVE PULL UP

[75] Inventors: Nimish K. Shah, Aurora, Ill.; Michael P. Singh, Seal Beach, Calif.

[73] Assignee: AT&T Bell Laboratories, Murray Hill, N.J.

[21] Appl. No.: 454,093

[22] Filed: Dec. 20, 1989

[51] Int. Cl.⁵ .................... H03K 3/284; H03K 3/26
[52] U.S. Cl. .................... 307/530; 307/451; 307/272.1; 307/279; 365/205
[58] Field of Search ............... 307/443, 448, 451, 530, 307/272.1, 279; 365/205

[56] References Cited

U.S. PATENT DOCUMENTS

| | | | |
|---|---|---|---|
| 4,634,901 | 1/1987 | McElroy | 307/530 |
| 4,716,320 | 12/1987 | McAdams | 307/443 |
| 4,727,267 | 2/1988 | Bernstein | 307/443 |
| 4,802,130 | 1/1989 | Soneda | 365/205 |
| 4,858,195 | 8/1989 | Soneda | 365/205 |

OTHER PUBLICATIONS

IBM Tech. Disc. Bul. "Integrated FET Latch Circuit" Williams vol. 19, No. 4, 9/76.

Primary Examiner—Stanley D. Miller
Assistant Examiner—Margaret Rose Wambach
Attorney, Agent, or Firm—D. A. Marshall

[57] ABSTRACT

A sense amplifier includes two cross-coupled pull down field effect transistors, each connected to a respective pull up field effect transistor and to respective bit lines for receiving sensed signals from a memory cell. During a sensing operation, two inverter circuits in response to sensed signals on the bit lines selectively disable the pull up transistor associated with the lower sensed signal and enable the pull up transistor associated with the higher sensed signal.

8 Claims, 2 Drawing Sheets

SENSE AMPLIFIER WITH SELECTIVE PULL UP

TECHNICAL FIELD

This invention relates to a sense amplifier and more particularly to a sense amplifier for amplifying sensed information signals appearing on bit lines from respective memory cells in a memory.

BACKGROUND OF THE INVENTION

In computer, information processing and control systems, it is necessary to store digital data and to retrieve it as desired. In a semiconductor memory, an array of storage or memory cells is used, with each memory cell holding one bit of data. When the information can be randomly put into or taken out of each memory cell or element as required, the array is called a random access memory (RAM) which may be static (SRAM) or dynamic (DRAM). The individual memory cells have data input and output lines, with each memory cell commonly having two output bit lines for indicating the presence of a 0 or 1 bit read out from the memory cell. The 0 and 1 bits are represented by different voltages which, when stored initially in the memory cells, may be quite close to each other and errors may accumulate tending to reduce the differences between the respective voltages to the order of tens of millivolts. Therefore, it is advantageous to include sense amplifiers connected to the output bit lines. These amplifiers are adapted to more accurately detect the voltages appearing on the bit lines and to latch the digital bit indicated thereby to provide a more accurate and faster readout.

One advantageous example of such a sense amplifier includes cross-coupled field affect pull down transistors, each having a first current carrying electrode (drain or source electrode) connected to a respective one of the bit lines and an associated pull up transistor, and a gate electrode connected to the other one of bit lines. Second current carrying electrodes (source or drain electrodes of the transistors) are connected together to receive a control signal which permits or prevents turning on of the transistors. If, for example, NMOS transistors are used, each transistor will turn on when the difference between the gate voltage and the source voltage is greater than the threshold voltage of the transistor. The signal to be sensed appears on only one of the bit lines which then carries a voltage higher or lower than the other bit line, depending on the value of the sensed signal. Consequently, when a control signal applied to the connected second current carrying electrodes is lowered to permit turn on of the two pull down transistors, a transistor having its gate electrode connected to the bit line carrying the higher voltage will turn on first. The other transistor will thereafter be maintained in its off state to latch the information read out from the memory cell.

The latching process of this type of sense amplifier having cross-coupled pull down transistors is accomplished by regenerative action. When the pull down transistor having its gate electrode connected to the bit line carrying the higher sensed voltage starts conducting, the other pull down transistor having its drain electrode connected to the bit line is off, the voltage on the bit line starts increasing gradually due to the pull up action of the pull up transistor associated with the pull down transistor in the off state. The increasing voltage on the bit line increases the voltage on the gate electrode of the conducting pull down transistor and causes it to conduct even more. This, in turn, causes the voltage on the drain electrode at the conducting pull down transistor, i.e., on the bit line carrying a lower voltage to decrease even more. However, this decrease is partially offset by the action of the pull up transistor associated with the conducting pull down transistor which attempts to pull the voltage up. To ensure that the low going bit line would decrease more and faster, the pull up transistor associated with the low going bit line should be smaller in size so that the current through it is small. However, a smaller pull up transistor associated with the high going bit line will increase the time it will reach its final high value. It is clear from the above discussion that of the two pull up transistors, only one serves a useful purpose, i.e., the one that pulls up the high going bit line. The other one plays a negative role by continuing to pull up the low going bit line.

SUMMARY OF THE INVENTION

In accordance with the present invention, we provide a sense amplifier including first and second bit lines for receiving sensed signals and first and second cross-coupled pull down transistors, each having a gate electrode and first and second current carrying electrodes, the first current carrying electrodes of each being connected to the bit lines; and first and second pull up transistors, each having a gate electrode and first and second current carrying electrodes, the second current carrying electrodes of each being connected to the first current carrying electrodes of the first and second pull down transistors, respectively.

In accordance with the present invention, an arrangement including first and second inverter circuits responsive to the sensed signals of the first and second bit lines selectively enables one of the pull up transistor while disabling the other one.

DETAILED DESCRIPTION

Figure 1:
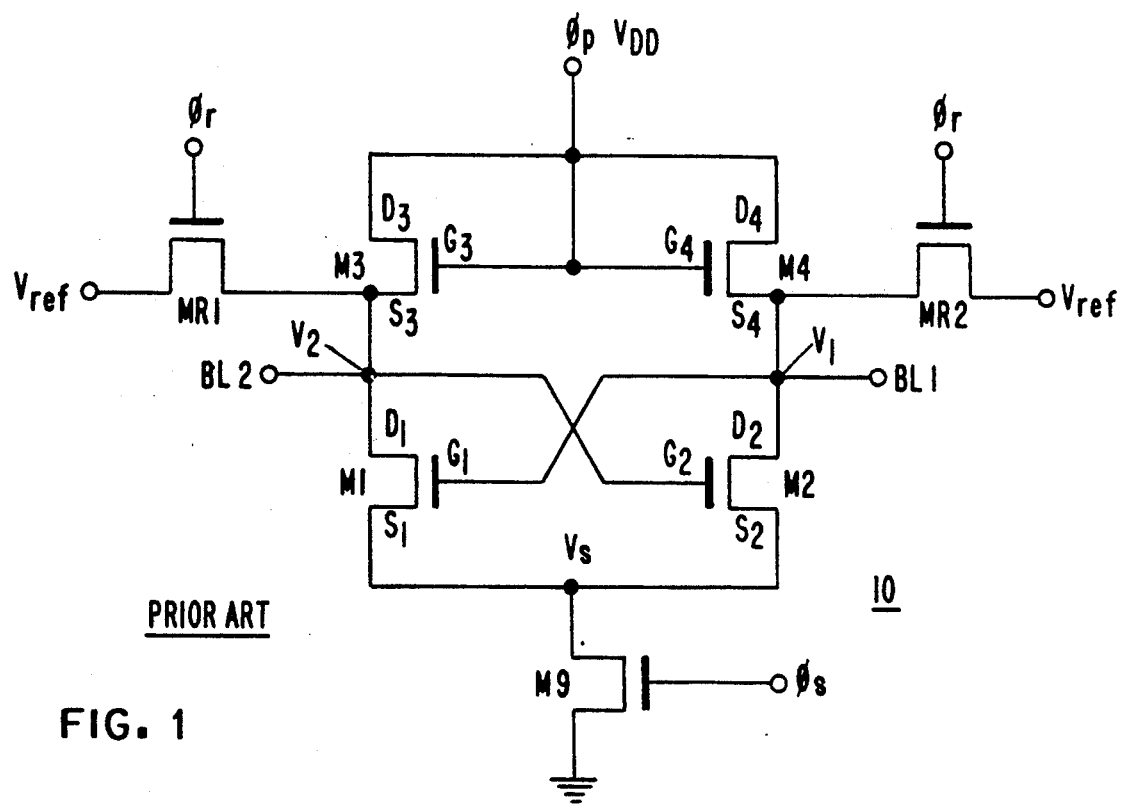
FIG. 1 is a circuit diagram of a conventional, prior art sense amplifier.
Figure 3:
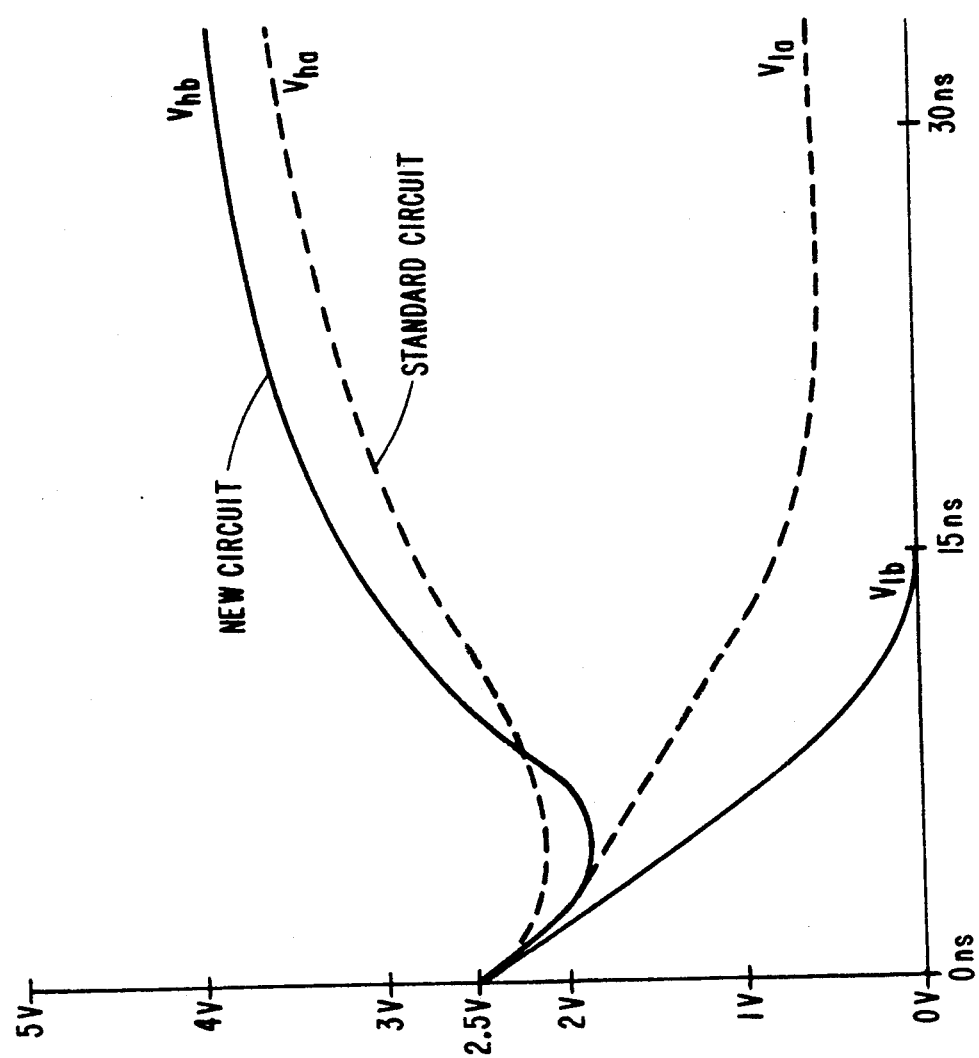
FIG. 3 is a diagram illustrating output voltages as a function of time of the conventional and new amplifiers.

In order that the purpose served by the present invention may be fully appreciated, a sense amplifier 10, according to the prior art, will be first described with reference to FIGS. 1 and 3. As shown in FIG. 1, sense amplifier 10 has four field effect transistors (FETs) M1, M2, M3, and M4, which in the illustrated example are NMOS field effect transistors (n-channel FETs). Those skilled in the art will recognize that a corresponding sense amplifier could be constructed using PMOS field effect transistors with appropriate changes in the control signals.

Transistor M1 has its drain electrode D1 connected to a second bit line BL2 extending from a memory cell (not shown) and to a source electrode S3 of transistor M3. Correspondingly transistor M2 has its drain electrode D2 connected to a first bit line BL1 extending from the memory cell and to the source electrode S4 of transistor M4. Transistors M1 and M2 also include source electrodes S1 and S2 respectively, which are connected together to receive a common control signal via a control transistor M9 upon application of a control signal $\phi_s$ to transistor M9. Gate electrodes G3 and G4, and drain electrodes D3 and D4 of transistors M3 and M4, respectively, are connected together and are controlled by a control signal $\phi_p$. The gate electrode G1 of transistor M1 is connected to the bit line BL1 while the gate electrode G2 of transistor M2 is connected to the bit line BL2.

In the arrangement described above, transistors M1 and M2 are cross-coupled in a basic regenerative scheme and operate as pull down transistors. Transistors M3 and M4 each associated with transistors M1 and M2, respectively, operate as pull up transistors in the latching process of the sense amplifier.

A reference voltage $V_{ref}$ is supplied to the bit line BL1 through a control transistor MR2 which is turned ON and OFF in response to control signal $\phi_r$. Reference voltage $V_{ref}$ is also supplied to bit line BL2 through a control transistor MR1 similarly controlled by a control signal $\phi_r$. Control transistors MR1, MR2 and M9 are constructed in the same technology as transistors M1 through M4.

The operation of sense amplifier 10 will now be discussed. Before the starting of the sensing operation, control signal $\phi_r$ is initially at a high level to maintain transistors MR1 and MR2 in the ON condition so that $V_{ref}$ is impressed on both bit lines BL1 and BL2. During the sensing operation, MR1 and MR2 are turned OFF. One bit line is maintained at $V_{ref}$ and the output of the memory cell is applied to the other bit line. Depending on the value of the stored bit (0 or 1) in the memory cell, the bit line will be at $V_{ref}-V_d$ (for 0 bit). For the purpose of this example, let it be assumed that the bit to be read out of the memory cell is a digital 0, having a differential voltage $V_d$ which is impressed on the bit line BL1 as $V_{ref}-V_d$ in accordance with known principles. Sense amplifier 10 is provided for sensing sense voltage $V_d$, and outputting at a output node $V_1$ a low voltage $V_{la}$ equal to a standard voltage for a 0 bit in a particular system, which voltage can be recognized as such by other circuit elements. Similarly, sense amplifier 10 will output at output node $V_1$ a high voltage $V_{ha}$ equal to the standard voltage for a 1 bit in a particular system when differential voltage $V_d$ indicating a stored 1 bit is read out from the memory cell and impressed on the bit line BL1 as $V_{ref}+V_d$.

As is well-known in the art, n-channel FET transistors, such as shown in FIG. 1, turn ON only when the gate to source voltage ($V_{gs}$) is greater than the threshold voltage $V_{th}$. Threshold voltage is positive for the n-channel FETs and may be in a range of 1 to 4 volts.

At some point in time, the sensing operation is initiated by applying the output of the memory cell to one of the bit lines and applying control signals $\phi_s$ and $\phi_p$ to the circuit. Let us assume that bit line BL1 is at initial sensed voltage $V_{ref}-V_d$ and bit line BL2 is at voltage $V_{ref}$. As transistor M9 starts conducting and voltage on $V_s$ decreases, transistor M2 turns ON first when gate to source voltage $V_{gs2}$ is greater than the threshold voltage $V_{th2}$. This will cause voltage at output node $V_1$ to decrease. If $V_s$ decreases faster than voltage at $V_1$, transistor M1 may conduct temporarily, but eventually voltage at $V_1$ will decrease sufficiently to turn transistor M1 OFF. During this time, transistor M3 tries to pull up the voltage at $V_2$ causing transistor M2 to conduct more heavily which tends to decrease voltage at $V_1$. Transistor M4, however, which is also conducting has a negative effect on the voltage at $V_1$ in that it tends to pull up the voltage of $V_1$. According to well-known principles, eventual value of voltage at $V_1$ ($V_{la}$ of FIG. 2) depends upon the division of impedance between the three conducting transistors M4, M2, and M9. To ensure that the voltage at $V_1$ drops to a value sufficiently low for the external logic to sense it as a digital 0, pull up transistors should be smaller in size compared to the pull down transistors, but providing smaller pull up transistors also means that the voltage at the high going node will increase at a slower rate. That is, if the sense amplifier 10 would be sensing a bit 1, pull up transistor M3 would have a negative effect on the latching process.

It is obvious from the above discussion that in the case discussed for sensing the 0 bit, of the two pull up transistors M3 and M4, only M3 serves a useful purpose by pulling up the high going node $V_2$, whereas the transistor M4 slows down the low going node $V_1$ by continuing to pull it up.

Figure 2:
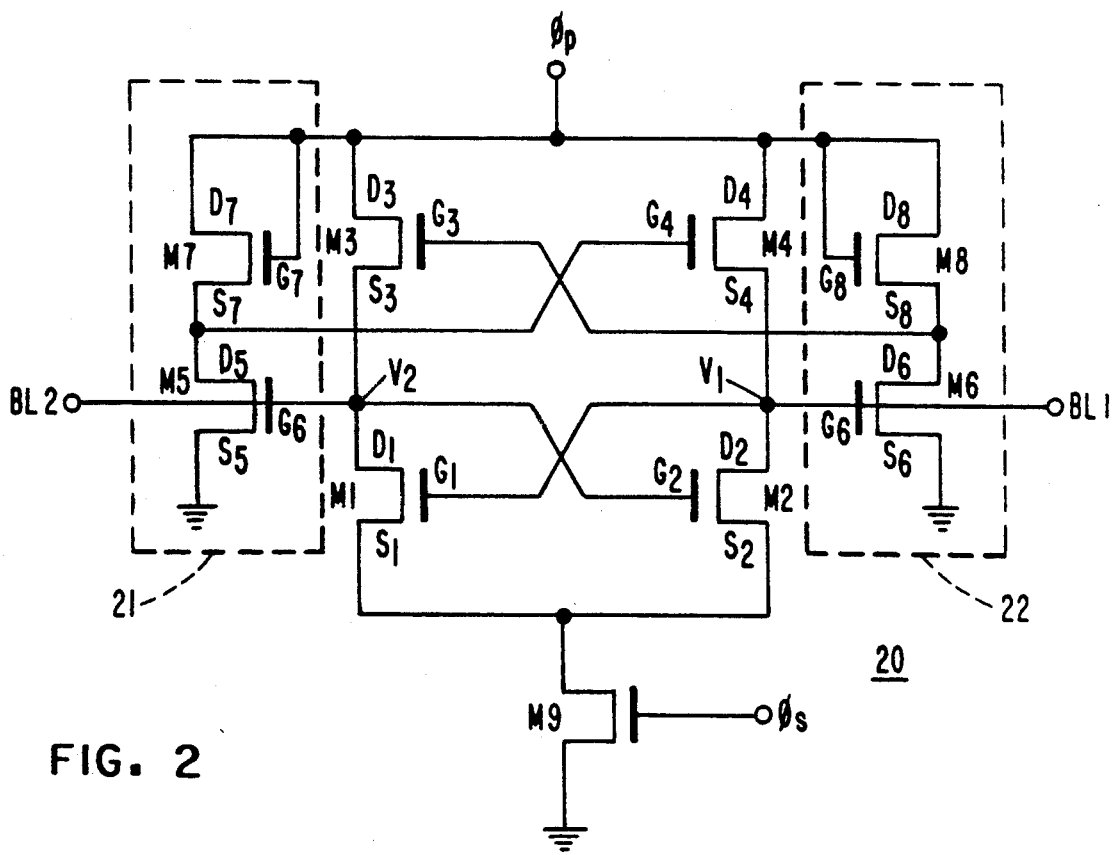
FIG. 2 is a circuit diagram of a sense amplifier in accordance with the present invention.

The present invention eliminates the above-described problem by sensing which output node will go low and then by selectively turning OFF the pull up transistor associated with the low going node during the latching process. An improved sense amplifier 20 is shown in FIG. 2 wherein two inverters 21 and 22 are added to the prior art sense amplifier 10, as shown in FIG. 1. Gate electrodes G3 and G4 of pull up transistors M3 and M4 are cross connected to inverters 22 and 21, respectively. Inverter 21 includes transistors M5 and M7 and inverter 22 includes transistors M6 and M8. Transistors M5 through M8 are also NMOS field effect transistors. The threshold voltages of transistors M5 and M6 are adjusted to be near $V_{ref}$ to ensure quick turning on and off of the two transistors.

The operation of the sense amplifier 20 embodying the present invention will now be described. During the sensing operation, bit lines BL1 and BL2 are precharged to $V_{ref}$ as explained in discussion of the operation of the sense amplifier 10. Transistors MR1 and MR2 are not shown in FIG. 2 to simplify the circuit. Let us assume that bit 0 is sensed at bit line BL1 and that bit line BL2 is kept at the reference voltage $V_{ref}$. As explained previously, bit line BL1 will have $V_{ref}-V_d$ impressed upon it. When at some point in time the sensing operation is initiated by applying control signals $\phi_s$ and $\phi_p$, transistor M2 turns ON first when $V_{gs2}$ is greater than the $V_{th2}$. Once transistor M2 starts conducting, voltage at the output node $V_1$ will decrease. At this time transistor M1 is still OFF and transistor M3 pulls up the voltage at node $V_2$ just above the threshold voltage $V_{th5}$ of transistor M5, allowing it to turn ON. Once transistor M5 starts conducting, voltage on its drain electrode D5 which is connected to gate electrode G4 of pull up transistor M4 will decrease, turning OFF transistor M4 and keeping it in the OFF state. Keeping the pull up transistor M4 from conducting will ensure that voltage at the output node $V_1$ will drop at a faster rate. At the same time, since output node $V_1$ starts at reference voltage $V_{ref}-V_d$ which is less than the threshold voltage $V_{th6}$ of transistor M6 and is continuously decreasing because transistor M4 is off, transistor M6 having its gate electrode G6 connected to output node $V_1$ stays OFF thereby ensuring that pull up transistor M3 stays ON to pull up the voltage at the output node $V_2$.

Figure 4:
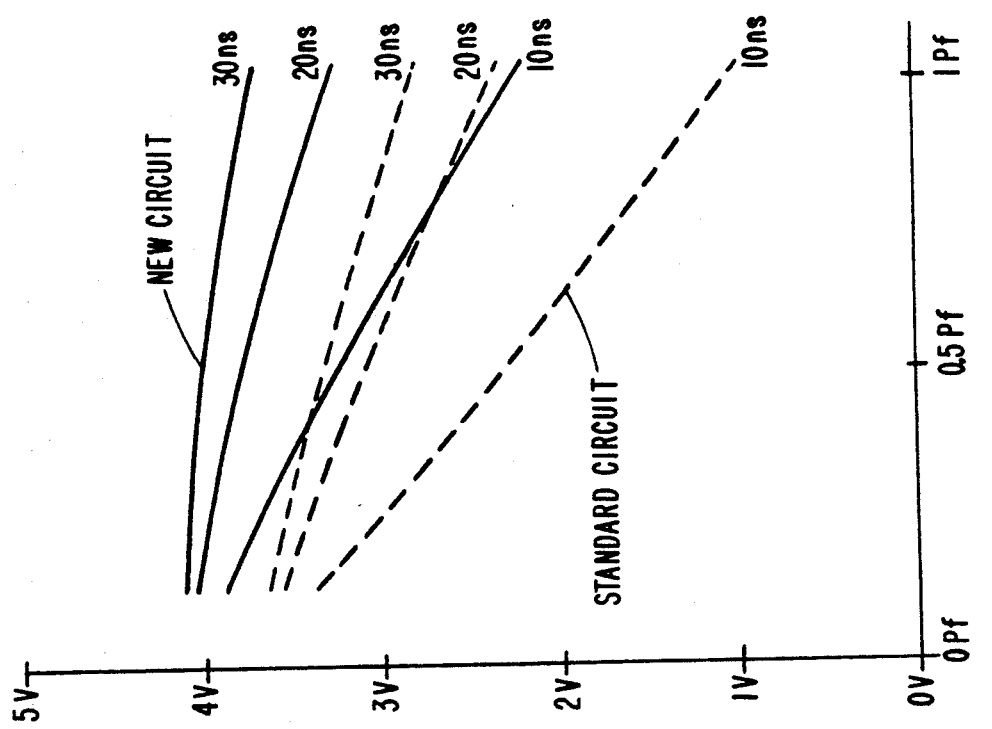
FIG. 4 is a diagram illustrating differential output voltages as a function of output load capacitance for the conventional and new amplifiers.

The disclosed new sense amplifier 20 allows for use of large size pull up transistors, ensuring quick latching of the high going node because the pull up transistor associated with the low going node remains OFF and thus cannot slow down the latching process. Thus, the response time of this circuit is much faster than that of the standard sense amplifier circuit as can be seen from computer simulated results shown in FIGS. 3 and 4.

Additionally, use of large size pull up transistors ensures that the voltage at the high going node at any time during the sensing process will be higher and the voltage at the low going node will be lower than the corresponding voltages of the standard circuit. Furthermore, since the pull up transistor associated with the output of the low going node is OFF, the voltage at the output node will be 0, providing a large noise margin for the sensed low state of the memory cell. Normally the output node drives a buffer gate and the buffer drives the output pin of a chip. Larger noise margins will be beneficial in solving noise problems at these points.

We claim:

1. A sense amplifier including first and second bit lines for receiving sensed signals, the amplifier comprising:

first and second cross-coupled pull down field effect transistors each having a gate electrode and first and second current carrying electrodes with said second current carrying pull down transistor electrodes coupled together and returned to a first control signal and with said first current carrying pull down transistor electrodes each connected to a different one of said bit lines and cross-connected to said gate electrode of the other pull down transistor;

first and second pull up field effect transistors each having a gate electrode and first and second current carrying electrodes with said first current carrying pull up transistor electrodes coupled together and returned to a second control signal and with said second current carrying pull up transistor electrodes each connected to a first current carrying pull down transistor electrode of a corresponding pull down transistor, respectively; and means connected to said first and second current carrying electrodes of each pull up transistor and cross-connected to said gate electrodes of the other pull up transistor and responsive to said sensed signals on said first and second bit lines for selectively maintaining one of the pull up transistors in the OFF state and the other in the ON state.

2. A sense amplifier according to claim 1, wherein said selectively maintaining means includes first and second inverter means.

3. A sense amplifier according to claim 2, wherein said gate electrodes of the first and second pull up transistors are connected to said second and first inverter means, respectively.

4. A sense amplifier in accordance with claim 3, wherein the inverter means responding to the lower of the sensed signals on said bit lines, maintains the pull up transistor connected to said inverter means in the OFF condition.

5. A sense amplifier in accordance with claim 4, wherein the inverter means responding to the higher of the sensed signals on said bit lines, maintains the pull up transistor connected to said inverter means in the ON condition.

6. A sense amplifier according to claim 3, wherein said first and second inverter means each includes first and second field effect transistors, each transistor having a gate electrode and first and second current carrying electrodes.

7. A sense amplifier in accordance with claim 6, wherein the first current carrying electrode of the first transistor of each first and second inverter is connected to the gate electrode of said second and first pull up transistors, respectively.

8. A sense amplifier in accordance with claim 7, wherein the gate electrode of the first transistor of each first and second inverter is connected to the gate electrode of said second and first pull down transistors, respectively.

* * * * *